United States Patent [19]
Clark et al.

[11] 3,953,808
[45] Apr. 27, 1976

[54] SOLID STATE AMPLIFIER
[75] Inventors: Charles W. Clark, Pleasant Hill, Mo.; Edwin G. Morton, Lynnfield, Mass.; Robert L. Voss, Lee's Summit, Mo.
[73] Assignees: Bell Telephone Laboratories, Incorporated, Murray Hill, N.J.; Western Electric Co., Inc., New York, N.Y.
[22] Filed: Apr. 28, 1975
[21] Appl. No.: 572,577

[52] U.S. Cl. .............................. 330/35; 307/304; 307/320; 315/52; 330/22
[51] Int. Cl.² .......................................... H03F 3/16
[58] Field of Search .............. 307/304, 320; 315/52; 330/35

[56] References Cited
UNITED STATES PATENTS

| 2,618,690 | 11/1952 | Stuetzer | 175/366 |
|---|---|---|---|
| 3,325,654 | 6/1967 | Mrazek | 307/320 X |
| 3,351,654 | 9/1970 | Eby | 307/202 |
| 3,501,806 | 5/1970 | Gremillet | 333/80 |
| 3,742,261 | 6/1973 | Schneider et al. | 307/304 |
| 3,757,245 | 9/1973 | Berger | 331/66 |
| 3,767,946 | 10/1973 | Berger et al. | 307/304 |

OTHER PUBLICATIONS
Compton–"Designing with FETs in Cascode"– Edn Magazine, Sept. 14, 1966.
"Cascode Stage Using FETs"–Electronic Design, Vol. 12, p. 76, May, 1964.
Holt et al., "Hybrid Integrated Networks"– The Western Electric Engineer, Jan. 1975.

Primary Examiner—R. V. Rolinec
Assistant Examiner—Lawrence J. Dahl
Attorney, Agent, or Firm—W. O. Schellin

[57] ABSTRACT
A solid state amplifier includes at least one junction field effect transistor and an impedance network coupled between a signal input terminal of the amplifier and a gate terminal of the transistor. The network includes a p-n junction device having a region of conductivity opposite to that of the gate of the transistor coupled to the gate terminal, the p-n junction being shunted by a resistor coupled in parallel therewith. The network minimizes signal distortion which would otherwise be introduced to the signal output of the amplifier when an inductive load is present in the output circuit of the amplifier.

12 Claims, 3 Drawing Figures

SOLID STATE AMPLIFIER

BACKGROUND OF THE INVENTION

1. Field of the Invention

This invention relates generally to solid-state devices and more particularly to a solid-state signal amplifier, the use of which contemplates an inductive load in the output circuit of the amplifier.

2. Discussion of the Prior Art

In recent years steps have been undertaken in the communication industry and particularly the telephone industry to replace vacuum tubes that are in existing circuits with solid-state devices. Such solid-state replacement devices advantageously use one or more n-channel junction field-effect transistors as active elements. N-channel junction field-effect transistors are well suited for one-for-one vacuum tube replacement applications because their current flow from a source of negative or n-type conductivity through an n-type channel to a drain of n-type conductivity is controlled by a gate of p-type conductivity which forms a p-n junction with the channel. Similarly, to grid voltages on vacuum tubes, gate voltages applied to the n-channel field-effect transistors are normally slightly negative with respect to ground, and they increase the drain current as they become more positive. In replacing vacuum tubes with n-channel field-effect transistor circuits, the transconductance (gm) of the transistor circuits is chosen to be equivalent to that of the replaced vacuum tubes. Consequently, for a given change in the voltage applied to either the grid or gate, a predetermined change in the plate or drain current results.

The field-effect transistors have advantages over vacuum tubes with similar characteristics in that they consume less power than the vacuum tubes they replace. In addition, such solid state replacements for the vacuum tubes appear to have a longer life span and more stable characteristics over the active service life than their vacuum tube counterparts.

Attempts to replace a twin triode vacuum tube in a channel regulator of a telecommunication carrier system have met with considerable difficulty. In this carrier system, voice frequency communication signals are received as amplitude modulations of a basic carrier frequency signal. The carrier frequency signal is applied to the channel regulator unit through an input transformer. A signal output from the transformer is applied to a two-stage amplifier circuit. The output from the amplifier circuit is coupled through an output transformer to a demodulator circuit which rectifies the carrier frequency. The negative potential of the rectified or demodulated carrier frequency is fed back and algebraically added to a bias voltage to control the amplification of the signal. Thus, a decline in the carrier signal amplitude results in a less negative feedback and in a consequently increased signal amplification. Conversely, an increase in the carrier signal results in a more negative feedback and net bias of the amplifier and a lesser amplification of the carrier signal.

The gain of the amplifier in the channel regulator unit is substantially inversely proportional to the input amplitude or level of the carrier frequency. The voice frequency, being an amplitude variation of the carrier frequency, is amplified proportionately to the amplification of the carrier frequency in the channel regulator unit. The channel regulator unit consequently automatically controls the output amplitude of the voice frequency signal.

In replacing the twin triode amplifier tube of the prior art unit with a solid state amplifier device, such an automatic gain control of the applied signal is lost if the net negative DC feedback from the demodulated carrier signal does not correspond to a voltage feedback required to control the gain of the amplifier device. In prior attempts to replace each of the stages of the prior art twin triode tube with junction field-effect transistor circuits a lack of regulation of the signals, an inability to obtain desired output signal levels at some carrier frequencies, and various other problems resulted.

From the foregoing, it appears desirable to have a circuit with the advantages of a solid-state circuit and the characteristics and properties of a twin triode tube, the gain of which can be controlled by the feedback of a negative biased voltage which results from the demodulation of the output of the amplifier device.

SUMMARY OF THE INVENTION

It is therefore an object of the invention to provide new and improved solid-state amplifiers.

It is also an object of the invention to reduce signal distortion in an inductive field-effect transistor circuit.

It is another object of the invention to replace a vacuum tube with a solid-state device in a circuit wherein a signal amplifier is coupled to an inductive output loop.

It is a further object of the invention to replace a twin triode vacuum tube functioning in a channel regulator unit with a solid state device.

In accordance with the objects of this invention, a solid-state amplifier includes a junction field-effect transistor having a gate contact adjacent a semiconductive gate region of a first type conductivity. The amplifier further includes a signal input terminal and an impedance coupled between the input terminal and the gate contact, the impedance including a second semiconductive device having a region of the first type conductivity, a region of a second type conductivity and a junction therebetween. The second device is coupled with the region of the first type conductivity to the signal terminal and with the region of the second type conductivity to the gate terminal. An isolation impedance is coupled in parallel with the second device between the signal input terminal and the gate contact.

BRIEF DESCRIPTION OF THE DRAWING

The detailed description of a preferred embodiment within the scope of this invention will be better understood when reference is made to the accompanying drawing wherein.

DETAILED DESCRIPTION OF THE INVENTION

Figure 1:
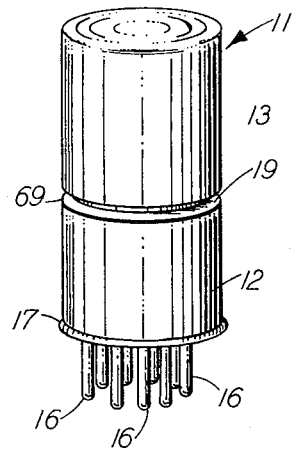
FIG. 1 is a pictorial view of a device described herein as a preferred embodiment of the invention.

Referring now to FIG. 1, a device designated generally by the numeral 11, is a replacement for a twin triode vacuum tube. In distinction over single envelopes or cylinders of other known solid-state devices for replacing vacuum tubes, the device 11 has a lower cylinder 12 and an upper cylinder 13 for housing various circuit components. A plurality of pins 16 extend from a base surface 17 of the lower cylinder 12. In the preferred embodiment, nine pins 16 are arranged in a pattern corresponding to the pattern of pins on the respective twin triode vacuum tube to facilitate a one-for-one replacement of the tube.

Assembling the circuit components of the device 11 in the two distinct cylinders 12 and 13 offers advantages in the manufacture of the device 11. The lower cylinder 12 is used to house already packaged components. Unpackaged components, such as semiconductor chips, are mounted and electrically connected in a conventional manner in the upper cylinder 13. It should be realized, however, that packaging all components of the device 11 within a single cylinder is nevertheless within the scope of the present invention. In the device 11, electrical connections between the lower cylinder 12 and the upper cylinder 13 are established by connector pins similar to the connector pins 16 and by corresponding standard tube pin sockets (not shown). Other provisions for joining the upper cylinder 13 to the lower cylinder 12, such as by permanent solder connections, are also contemplated as being within the scope of this invention.

Figure 2:
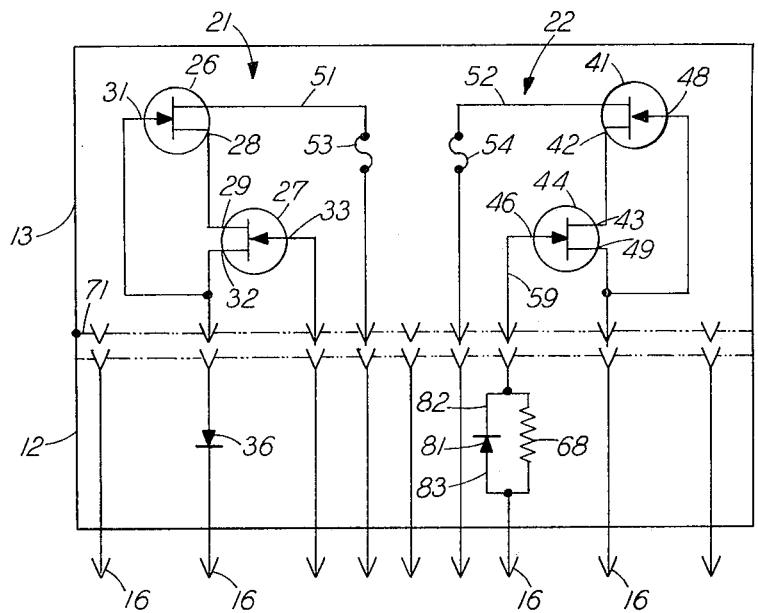
FIG. 2 is a schematic diagram of the electronic circuit of the device in FIG. 1.

Referring now to FIG. 2 there is shown a schematic diagram of circuits and of the components housed in the cylinders 12 and 13. In general, two distinct amplifier circuits 21 and 22 are shown. These circuits 21 and 22 correspond, respectively, to a first and a second triode amplifier of a twin triode tube (not shown). In each of the circuits 21 and 22, field-effect transistors are similarly used as basic amplifier elements by interconnecting in a conventional manner a high-voltage transistor and a low-voltage transistor in what is commonly referred to as a cascoding arrangement.

In the amplifier circuit 21, a high voltage field-effect transistor 26 is connected in cascode with a low-voltage, high-gain field-effect transistor 27. As shown in FIG. 2, a source terminal 28 of the high-voltage transistor 26 is coupled to a drain terminal 29 of the low-voltage transistor 27, and a gate terminal 31 of the high-voltage transistor 26 is coupled to a source terminal 32 of the low-voltage transistor 27. In this connection, the high-voltage transistor 26 shields the low-voltage transistor 27 from excessive drain voltages, while other significant characteristics such as the gain characteristics of the low-voltage transistor 27 become the characteristics of the combination of the two transistors. A gate terminal 33 of the transistor 27 becomes the signal input terminal for the combination of the transistors 26 and 27.

In the circuit 21, the anode of a diode 36 is coupled toward the source terminal 28 of the transistor 26 and the cathode of the diode 36 is coupled to the corresponding pin 16. The diode 36, as a discrete device, is housed in the lower cylinder 12 of the device 11.

Diodes are known to have been coupled into source leads of prior art solid-state vacuum tube replacements to prevent reverse source voltages from damaging respective solid state components and other related components. The diode 36, however, is used in the circuit 21 to change pentode-like cutoff characteristics of the junction field-effect transistor to a more sudden drain current cutoff characteristic similar to that obtained with triodes. As current through the diode 36 decreases, its rapidly increasing impedance biases the circuit 21 into a pinch-off condition. It has been found that without the use of the diode 36 in the source lead of the circuit 21, regulation requirements of an exemplary circuit of the type shown in FIG. 3 were not met.

Similarly to the transistors 26 and 27 in the circuit 21, two cascoded transistors form, in combination, an amplifier element of the circuit 22. A source terminal 42 of a high voltage field-effect transistor 41 is coupled to a drain terminal 43 of a low voltage field-effect transistor 44.

A gate terminal 46 of the low voltage transistor 44 is the signal input terminal of the cascoded circuit 22. A gate terminal 48 of the transistor 41 is consequently coupled directly to a source terminal 49 of the transistor 44 to complete the cascoded circuit.

Referring to FIG. 2, a drain lead 51 of the transistor 26 and a drain lead 52 of the transistor 41 are coupled to fuses 53 and 54 respectively. The fuses 53 and 54 protect circuit components external to the device 11 from damage which might result from unchecked excessive drain current through the circuits 21 or 22.

Figure 3:
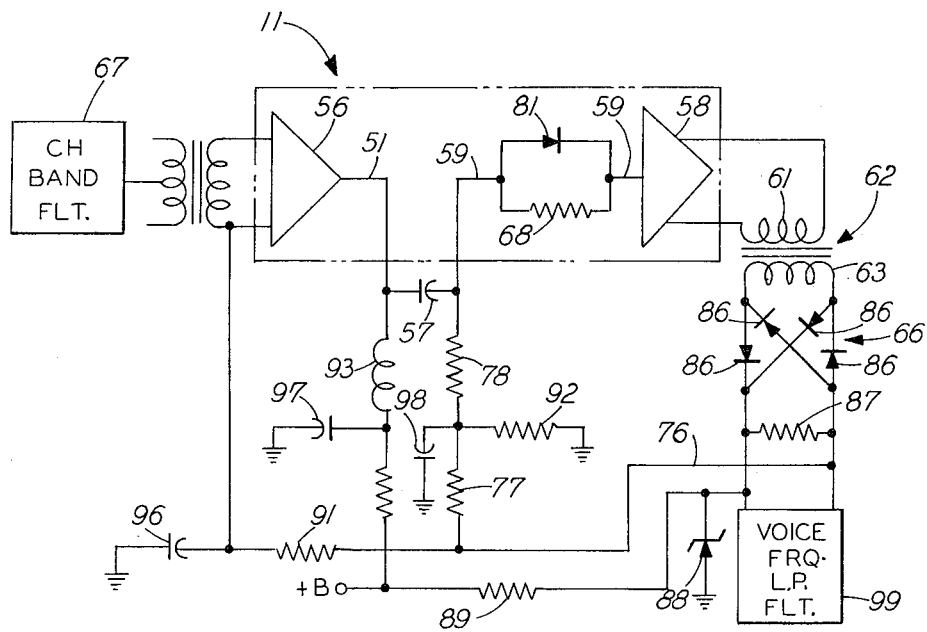
FIG. 3 is a channel-regulator unit as a typical example of an inductive load circuit, wherein the device of FIG. 1 replaces a vacuum tube in accordance with the present invention.

Referring now to FIGS. 2 and 3, the amplifier circuit 21 corresponds to a first amplifier stage 56 which is coupled through a capacitor 57 to a second amplifier stage 58. The amplifier circuit 22 corresponds to the second amplifier stage 58. Output signals from the first stage 56, which appear on the drain lead 51 are coupled through the capacitor 57 and through a gate terminal lead 59 to the gate terminal 46 of the transistor 44 of the second stage 58. The second stage 58 further amplifies the signals. The amplified signals from the second stage 58 are coupled to an inductive load, in particular to a primary coil 61 of a coupling transformer 62. A secondary coil 63 of the transformer 62 is part of a demodulator circuit 66.

The exemplary circuit of FIG. 3 receives signals of a specific carrier frequency from a channel band filter 67. The carrier frequency typically lies in a range between 168 and 264 kilohertz. At these frequencies, device capacitances of the field-effect transistors 41 and 44 tend to shunt signal currents from the capacitor 57, thus affecting the voltages of the applied signals. A resistor 68, coupled into the lead 59, is selected to isolate the signals from such effective device capacitances which would shunt the signals to ground through the source terminal 49 of the transistor 44.

An acceptable value of the resistor 68 has been selected by considering, in the exemplary case, the lowest frequency as the most significant frequency. The frequency of 168 kilohertz corresponds to a period of $6 \times 10^{-6}$ seconds. A value for the resistor 68 has been chosen as one factor in the product with an effective device capacitance of $30 \times 10^{-12}$ Farads to yield a resistor-capacitance time constant of $6 \times 10^{-6}$ seconds. Dividing $6 \times 10^{-6}$ by $30 \times 10^{-12}$ results in a resistor value of 200,000 ohms. While the resistor 68 with such a value lowers the voltage gain of the circuit 22, a loss in the gain is acceptable because of initially higher gain characteristics of the pentode-like field-effect transistor circuit 22 with respect to the voltage gain characteristics of the replaced triode vacuum tube.

The inductance of the primary coil 61 in the output circuit of the second stage 58 causes a phase shift in the output signals with respect to the input signals. Even small device capacitances in the circuit 22 tend to feed back the output signals to the gate terminal 46 of the transistor 44. Such feedback signals are vectorially added to the input signals applied through the capacitor 57 to result in distorted signals.

To reduce signal distortion it is, therefore, desirable to eliminate undesirable feedback paths. A feedback path has been eliminated by grounding a metal mounting base or header 69 (see FIG. 1) to which the transistors 26, 27, 41 and 44 are mounted in a conventional manner. Grounding is effected by an appropriate case connection 71 to one of the pins 16 which corresponds to a ground pin in the replaced vacuum tube. The connection 71 shunts to ground all stray capacitances caused by mounting the transistors to the header 69 to minimize drain-to-gate capacitances in the circuit 22.

Even with such precautions as grounding stray capacitances, signal distortion is nevertheless not eliminated. The signal distortion is apparently caused by input signals to the gate terminal 46 which forward bias the gate junction of the transistor 44. It is known that an increased transconductance and a resulting increased gain also increases gain-dependent device capacitances which are also referred to as Miller-effect capacitances. And, as the gate terminal 46 becomes forward biased, the gain of the circuit 22 increases substantially. It is theorized that upon the gate terminal 46 becoming more forward biased by positive swinging input signals, a resulting increase in the feedback of the phase-shifted output signals from the circuit 22 accounts for distortion of the input signals. Subsequent demodulation of the distorted output signals by the demodulator circuit 66 causes an erroneous D.C. bias voltage to be fed back through a lead 76 and resistor 77, 78 and 68. Such erroneous bias voltages, in turn, prevent proper regulation of the signal level.

It has been discovered that such undesirable distortion of the input signals applied to the gate terminal 46 and the resulting erroneous bias feedback can be minimized or avoided to restore signal regulation similar to that obtained by the corresponding triode vacuum tube circuit. Accordingly, a semiconductor "p-n" junction device or diode 81 is coupled across the resistor 68. A cathode 82, the cathode being the "n" or negative type domain of the junction device of the diode 81, is coupled to the terminal of the resistor 68 which connects to the gate terminal 46. An anode 83, the anode being the "p" or positive type domain of the junction device of the diode 81, is coupled to the other side of the resistor 68.

It is believed that, as the signal voltage applied through the resistor 68 to the gate terminal 46 forward biases the gate terminal 46, and initial space charge current flow alters the voltage field applied through the gate terminal 46 to cause a change in the drain current of the circuit 22. The space charge current through the gate terminal 46, however, is complemented by a space charge current flow through the diode 81. As a result, the voltage applied to the gate terminal 46 corresponds substantially to the desired signal voltage applied through the resistor 48. The resulting field at the gate terminal 46 properly controls the drain current and the output voltage swing of the circuit 22. The storing and release of charge in the diode 81 during the forward biasing of the diode 81 and the gate terminal 46 corrects the signal distortion that would otherwise be caused by a drain current of the forward biased transistor 44 which affects the signal input voltage.

The capacity of the diode 81 to store a charge temporarily is significant to the extent that it is desirable to match the stored charge to that of the transistor 44. It has been found that a capacity of the diode 81 for storing 450–600 picocoulombs is desirable for the described embodiment. It should be understood that in lieu of the diode 81, a p-n junction of a transistor having an adequate storage charge characteristic can be used.

The described shunting of the resistor 68 with the diode 81 substantially eliminates undesirable distortion of the output signal amplitude. As a result, the output circuit of the device 11 generates regulated signals which substantially match those of the replaced vacuum tube. An initially higher transconductance of the circuit 22 is offset by the added input impedance of the resistor 68 and the diode 81. The net result is that the device 11 functions substantially as the twin triode vacuum tube with a self-biased transconductance of 3500 to 5500 micromhos.

Referring to FIG. 3, the output signals from the second stage 58 are coupled through the transformer 62 to the demodulator circuit 66. The circuit 66 is a full wave rectifier including four diodes 86. A load resistor 87 is coupled across the output from the circuit 66. A positive terminal of the rectifier circuit is clamped to an 18 volt reference or Zener diode 88 which, in turn, is referenced to ground. A dropping resistor 89 isolates the 18 volt reference potential from a high voltage plate or drain bias supply (+B). A negative terminal of the demodulator 66 is coupled through the lead 76 to provide the DC bias voltage to the input terminals of both amplifier stages 56 and 58. The supplied bias voltage is applied to the stage 56 through a current limiting resistor 91, and to the second stage 58 through the resistor 77 which functions as a voltage divider with a resistor 92. An inductor 93 functions as part of the signal coupling circuit in conjunction with the capacitor 57. Capacitors 96, 97 and 98 block D.C. bias components from ground or signal ground terminals. It should be realized that the circuitry described with respect to FIG. 3 is a simplified schematic of a telephone regulator circuit known by its Bell System designation as an N-1 Channel Regulator. As a result of its operation voice frequency signals of regulated levels are separated from the demodulated carrier signals in the demodulator circuit 66 and are applied through a voice frequency filter 99 to a telephone user line (not shown).

Referring again to FIG. 2, it is seen that input gate impedances such as the disclosed resistor 68 and the diode 81 can be usefully applied in amplifier circuits other than second stages of a twin triode vacuum tube replacement circuit. The disclosed combination of the resistor 68 and the diode 81 becomes of value to circuits wherein input signals cause an input gate of a field-effect transistor to become forward biased, and wherein an inductance in an output loop of such circuit would result in a phase-shifted output signal. Certain aspects of the present invention consequently find useful application in amplifier circuits in general.

The scope of the present invention is also not restricted to n-channel field-effect transistor circuits. While an illustrative example of the present invention is given specifically with respect to a vacuum tube replacement circuit for which n-channel field-effect transistors are ideally suited, signal distortions caused by feedback through device capacitances can occur in circuits employing p-channel type field-effect transistors as well. Consequently a resistor with a shunting diode can be employed in a gate lead of a p-channel transistor circuit to minimize such distortions. In the p-channel transistor circuit, however, because of the negative type conductivity of the gate region of the transistor, the anode of the diode would face the gate terminal, rather than the cathode 82, as it is disclosed for the n-channel transistor circuit 22 shown in FIG. 2.

It should, therefore, be kept in mind that various changes and modification in the novel aspects of the device 11 and in their application to other solid state devices are possible without departing from the scope and spirit of the invention. The invention is intended to be limited only by the scope of the appended claims.

What is claimed is:

1. A solid state amplifier, which comprises:
   a junction field-effect transistor having a gate contact adjacent a semiconductive gate domain of a first type conductivity; and
   an impedance coupled to the gate contact, the impedance including a charge storage device and a resistive impedance, the charge storage device having at least a semiconductive domain of the first type conductivity, a semiconductive domain of the second type conductivity and a junction there between, the domain of the second type conductivity being coupled to the gate terminal and the resistive impedance being coupled across the junction of the charge storage device.

2. An amplifier according to claim 1, wherein the junction field-effect transistor is an n-channel field-effect transistor, wherein the domain of the charge storage device coupled to the gate contact is of negative type conductivity, and wherein the resistive impedance is a resistor.

3. An amplifier according to claim 2, wherein the charge storage device is a diode having a cathode coupled to the gate contact, and wherein the resistor is coupled across the diode.

4. An amplifier according to claim 1, wherein the junction field-effect transistor is a control transistor having a drain contact and a source contact in addition to the gate contact, and wherein the resistive impedance in a resistor, the amplifier further comprising:
   a second field-effect transistor having gate, drain and source contacts, the source contact of the second transistor being coupled to the drain contact of the control transistor, and the gate contact of the second transistor being coupled to the source contact of the control transistor; and
   gate, source and drain terminals, the drain contact of the second transistor being coupled to the drain terminal, the source contact of the control transistor being coupled to the source terminal and the domain of the first type conductivity of the charge storage device being coupled to the gate terminal.

5. An amplifier according to claim 4, wherein the control transistor and the second transistor are n-channel field-effect transistors and the charge storage device is a diode, an anode of the diode being coupled to the gate terminal, a cathode of the diode being coupled to the gate contact of the control transistor, and the resistor being coupled to the cathode and to the anode of the diode.

6. A solid state device for replacement of a vacuum tube, the device comprising:
   an envelope, including a base, a housing, and a plurality of pins extending from the base in a pattern corresponding to pins on the vacuum tube, the pins including at least a drain pin, a source pin and a gate pin, corresponding to a plate pin, a cathode pin and a grid pin of the tube, respectively;
   an n-channel junction field-effect transistor circuit having drain source and gate contacts, the source contact being coupled to the source pin, and the drain contact being coupled to the drain pin; and
   an impedance coupled between the gate pin and the gate contact, the impedance including a semiconductive charge storage element having a domain of negative type conductivity, a domain of positive type conductivity and a junction there between, the domain of negative type conductivity being coupled to the gate contact and the domain of positive type conductivity being coupled to the gate pin, and a resistor being coupled in parallel to the charge storage element between the gate contact and the gate pin.

7. A device according to claim 6 wherein the charge storage device is a diode and the resistor is connected across the terminals of the diode.

8. A device according to claim 7, which comprises:
   a second n-channel junction field-effect transistor circuit having drain, source and gate contacts;
   a second diode an anode of which is coupled to the source contact of the second transistor circuit; and wherein
   the plurality of pins include a second drain pin, a second source pin, and a second gate pin corresponding to a second plate pin, a second cathode pin and a second grid pin of the vacuum tube, the second drain contact being coupled to the second drain pin, the second gate contact being coupled to the second gate pin and a cathode of the second diode being coupled to the second source pin, the second transistor circuit replacing an input amplifier stage and the transistor circuit having the impedance coupled between the gate pin and the gate contact replacing an output amplifier stage of the vacuum tube.

9. A device according to claim 8, wherein each of the transistor circuits comprises a high gain n-channel junction field-effect transistor and a high voltage, n-channel junction field-effect transistor, each of the transistors having a drain, a source and a gate and wherein in each circuit, the source of the high voltage transistor is coupled to the drain of the high gain transistor, the gate of the high voltage transistor is coupled to the source of the high gain transistor, the drain of the high voltage transistor corresponds to the drain contact of the respective circuit, the source of the high gain transistor corresponds to the source of the respective circuit and the gate of the high voltage transistor corresponds to the gate contact of the respective circuit.

10. A solid state replacement device for a vacuum tube, which comprises:
   an envelope, including a base, a housing and a plurality of pins protruding from the base in a pattern corresponding to a pattern of pins of the vacuum tube;
   a first transistor circuit comprising a first diode, a high gain, n-channel field-effect transistor and a high voltage, n-channel field-effect transistor, each transistor having a drain, a source and a gate, the source of the high voltage transistor being coupled to the drain of the high gain transistor, and the gate of the high voltage transistor being coupled to source of the high gain transistor, the source of high gain transistor being coupled to an anode of the diode, and the drain of the high voltage transistor, the gate of the high gain transistor and a cathode of the first diode being coupled, respectively, to first plate, grid and cathode pins extending from the base;

a second transistor circuit comprising a high gain, n-channel field-effect transistor, a high voltage, n-channel field-effect transistor, and an impedance circuit, each transistor having a drain, a source and a gate, the source of the high voltage transistor being coupled to the drain of the high gain transistor, and the gate of the high voltage transistor being coupled to the source of the high gain transistor, the impedance circuit including a second diode the cathode of which is coupled to the gate of the high gain transistor of the second circuit and a resistor which is coupled across the second diode, the anode of the second diode, the drain of the high voltage transistor of the second circuit and the source of the high gain transistor of the second circuit being coupled respectively to a second grid pin, a second plate pin and a second cathode pin of the pins extending from the base.

11. A device according to claim 10, wherein the envelope is divided into an upper cylinder and a lower cylinder, the upper cylinder including a header and a plurality of first electrical terminals facing toward the lower cylinder, the transistors of the first and second circuits being mounted to the header, the lower cylinder including a top surface, a plurality of second terminals corresponding to and electrically connecting the first terminals in the upper cylinder, and the base with the protruding pins, the first and second diodes and the resistor being mounted in the lower cylinder, the upper and the lower cylinder including means for coupling the drains of the high voltage transistors the gates of the high gain transistors and the sources of the high gain transistors to the respective pins, the diodes and the resistor in the lower cylinder and for coupling the cathode of the first diode to the first cathode pin, and the anode of the second diode to the second grid pin.

12. A device according to claim 10, wherein the second diode of the second transistor circuit has a charge storage capacity in the range of $300 \times 100^{-12}$ to $750 \times 10^{-12}$ coulombs.

* * * * *